(12) United States Patent
Ma et al.

(10) Patent No.: US 10,826,542 B2
(45) Date of Patent: Nov. 3, 2020

(54) SIGNAL TRANSCEIVING CONTROL STRUCTURE AND METHOD, ELECTRONIC DEVICE, AND STORAGE MEDIUM

(71) Applicant: SMARTER MICROELECTRONICS (SHANGHAI) CO., LTD., Shanghai (CN)

(72) Inventors: Jun Ma, Shanghai (CN); Qiang Su, Shanghai (CN); Yongle Li, Shanghai (CN)

(73) Assignee: SMARTER MICROELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/578,288

(22) Filed: Sep. 21, 2019

(65) Prior Publication Data
US 2020/0021316 A1    Jan. 16, 2020

Related U.S. Application Data

(63) Continuation of application No. PCT/CN2017/107462, filed on Oct. 24, 2017.

(30) Foreign Application Priority Data

Mar. 28, 2017    (CN) .......................... 2017 1 0193418

(51) Int. Cl.
| | | |
|---|---|---|
| *H04W 8/02* | (2009.01) | |
| *H04B 1/00* | (2006.01) | |
| *H03F 3/24* | (2006.01) | |
| *H03H 7/01* | (2006.01) | |
| *H03H 7/46* | (2006.01) | |
| *H03M 1/12* | (2006.01) | |
| *H04B 1/401* | (2015.01) | |

(52) U.S. Cl.
CPC ............... *H04B 1/005* (2013.01); *H03F 3/24* (2013.01); *H03H 7/0153* (2013.01); *H03H 7/463* (2013.01); *H03M 1/12* (2013.01); *H04B 1/401* (2013.01)

(58) Field of Classification Search
None
See application file for complete search history.

(56) References Cited

U.S. PATENT DOCUMENTS

| | | | |
|---|---|---|---|
| 7,593,703 B2 * | 9/2009 | Wiegner | ................. H01P 1/213 330/126 |
| 8,103,221 B2 * | 1/2012 | Ta | ............................ H04B 1/48 333/101 |

(Continued)

*Primary Examiner* — Tuan A Tran
(74) *Attorney, Agent, or Firm* — Syncoda LLC; Feng Ma (57) ABSTRACT

A signal transceiving control structure includes a power amplifier and N control branches. The N control branches are configured to control transmission of first signals or receiving of second signals of different network standards according to different control instructions. First ends of the N control branches are respectively connected to an output end of the power amplifier, second ends of the N control branches are respectively connected to N external output ends, third ends of the N control branches are respectively connected to N external input/output ends, wherein N is a positive integer greater than 1. The power amplifier is configured to perform power amplification on the first signals.

12 Claims, 5 Drawing Sheets

(56) References Cited

U.S. PATENT DOCUMENTS

| | | | | |
|---|---|---|---|---|
| 8,838,045 B2* | 9/2014 | Caron | .................. | H04B 1/52 |
| | | | | 455/73 |
| 8,886,137 B2* | 11/2014 | Mahmood | ................ | H01P 1/15 |
| | | | | 333/101 |
| 8,929,945 B1* | 1/2015 | Wei | .................... | H04B 1/0057 |
| | | | | 330/165 |
| 8,942,644 B2* | 1/2015 | Schell | ................ | H04B 1/0064 |
| | | | | 361/13 |
| 9,107,035 B2* | 8/2015 | Rahman | ................ | H04W 8/02 |
| 10,483,641 B2* | 11/2019 | Lehtola | ................ | H01Q 5/321 |
| 2003/0011443 A1* | 1/2003 | Liu | ........................ | H03H 7/38 |
| | | | | 333/126 |
| 2004/0204013 A1* | 10/2004 | Ma | ........................ | H04B 1/44 |
| | | | | 455/550.1 |
| 2007/0232241 A1* | 10/2007 | Carley | .................. | H04B 1/44 |
| | | | | 455/83 |
| 2009/0033435 A1* | 2/2009 | Otani | ...................... | H01P 1/15 |
| | | | | 333/103 |
| 2014/0120968 A1* | 5/2014 | Mahmood | ................ | H01P 1/15 |
| | | | | 455/501 |

* cited by examiner

SIGNAL TRANSCEIVING CONTROL STRUCTURE AND METHOD, ELECTRONIC DEVICE, AND STORAGE MEDIUM

CROSS-REFERENCE TO RELATED APPLICATIONS

The present application is a continuation of, and claims priority to, PCT/CN2017/107462 filed on Oct. 24, 2017, which in turn claims priority to Chinese Patent Application No. 201710193418.2 filed on Mar. 28, 2017. The disclosures of the above applications are hereby incorporated by reference in their entirety.

BACKGROUND

Along with the development of communication technologies, wireless radio-frequency circuit technologies are more widely applied, such as a wireless pager, a mobile phone, and a personal digital assistant (PDA). During an application process of the wireless radio-frequency circuit technology, a performance index of a radio-frequency circuit will have a direct impact on the quality of the whole product. An important aspect of these handheld products is miniaturization, and the miniaturization means that the components have high integration.

Figure 1:
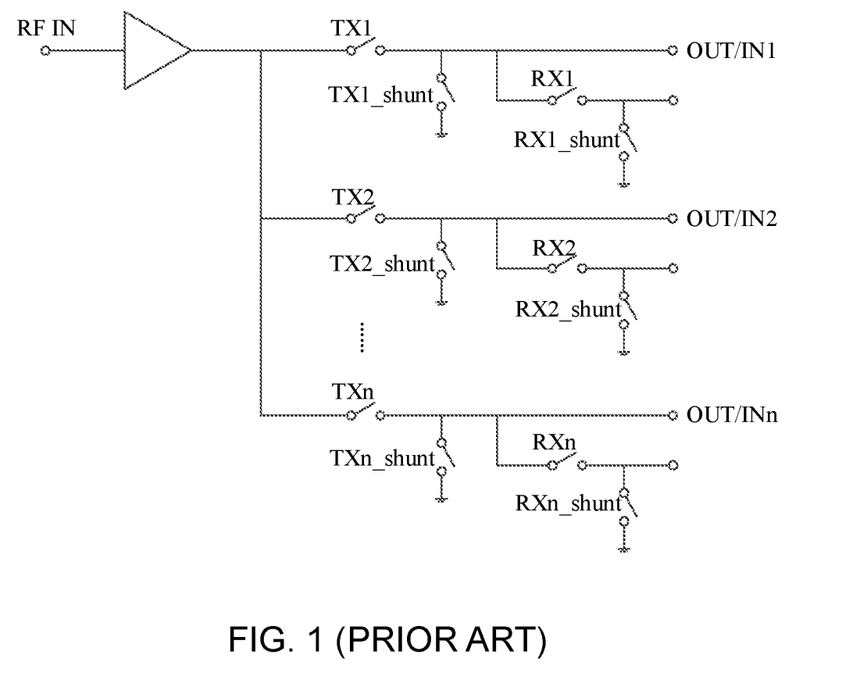
FIG. 1 is a schematic diagram of a composition structure of a signal transceiving control structure.

In a radio-frequency integrated circuit, in order to improve the isolation between ports of different transmitting branches and receiving branches, it may be needed to use a signal transceiving control structure in many application occasions. At present, the following solution is generally adopted for the signal transceiving control structure. As illustrated in FIG. 1, by adding parallel shunt switches, such as a switch of a transmitter parallel shunt TX1_shunt of a first branch and a switch of a receiver parallel shunt RX1_shunt of the first branch, the isolation between the ports is improved. However, four types of switches of TXi, RXi, TXi_shunt and RXi_shunt (i=1, 2 . . . n, where n is a positive integer) in each branch respectively need multiple control signals to close and open the four types of switches, and the number of the branches in the signal transceiving control structure is large. Therefore, a great number of control signals are required to control the switches. Moreover, each added control switch will occupy a certain chip area, therefore, it is difficult to satisfy a demand on high integration of components.

SUMMARY

The present disclosure relates generally to the technical field of radio-frequency circuits, and more specifically to a signal transceiving control structure and a method, an electronic device, and a storage medium. Various embodiments of the disclosure provide a signal transceiving control structure and a method, an electronic device, and a storage medium, which can reduce the complexity of a circuit and satisfy a demand on high integration of components.

The technical solutions of some embodiments of the present disclosure can be implemented as follows.

An embodiment of the disclosure provides a signal transceiving control structure, which includes a power amplifier and N control branches.

The N control branches are configured to control transmission of a first signal or reception of a second signal in different network types according to different control instructions. A first end of each of the N control branches is connected to an output end of the power amplifier. A second end of each of the N control branches is connected to each of N external output ends. A third end of each of the N control branches is connected to each of N external input/output ends. N is a positive integer greater than 1.

The power amplifier is configured to perform power amplification on the first signal.

In the above solution, the N control branches include N output control switches, N input control switches and N auxiliary control switches.

A first end of each of the N output control switches is connected to the power amplifier, and a second end of each of the N output control switches is connected to a first end of each of the N input control switches.

A second end of each of the N input control switches is connected to a first end of each of the N auxiliary control switches.

A second end of each of the N auxiliary control switches is grounded.

In the above solutions, the signal transceiving control structure further includes at least one signal processor configured to process the second signal to implement analog-to-digital conversion. Specifically, an input end of each of the at least one signal processor is connected to a second end of each of the N control branches, and an output end of each of the at least one signal processor is connected to each of the N external output ends.

In the above solutions, the signal transceiving control structure further includes: N filters, or N duplexers, or M filters and K duplexers, which are configured to perform filtering processing on the first signal and the second signal, where M and K are positive integers less than or equal to the N, and M+K=N.

An input end of each of the N filters is connected to a third end of each of the N control branches, and an output end of each of the N filters is connected to each of the N external input/output ends.

Or, an input end of each of the N duplexers is connected to a third end of each of the N control branches, and an output end of each of the N duplexers is connected to each of the N external input/output ends.

Or, an input end of each of the M filters is connected to a third end of each of M control branches in the N control branches, and an output end of each of the M filters is connected to each of M external input/output ends in the N external input/output ends. Each of the K duplexers is connected to a third end of each of the remaining K control branches in the N control branches. An output end of each of the K filters is connected to each of the remaining K external input/output ends in the N external input/output ends.

In the above solutions, when an i-th output control switch in an i-th control branch is ON, an i-th input control switch is OFF and an i-th auxiliary control switch is ON, the i-th control branch works in a transmitting state and is configured to control transmission of the first signal.

When the i-th output control switch in the i-th control branch is OFF, the i-th input control switch is ON and the i-th auxiliary control switch is OFF, the i-th control branch works in a receiving state and is configured to control reception of the second signal.

When the i-th output control switch in the i-th control branch is OFF, the i-th input control switch is ON and the i-th auxiliary control switch is ON, the i-th control branch works in an isolation state and is configured to control signal interference between the i-th control branch and N−1 control branches except the i-th control branch.

The i-th control branch is one of the N control branches, where i is a positive integer less than or equal to N.

In the above solutions, when the i-th control branch works in the transmitting state, and the N−1 control branches except the i-th control branch work in the isolation state, the signal transceiving control structure is configured to transmit the first signal.

When the i-th control branch works in the receiving state, and the N−1 control branches except the i-th control branch work in the isolation state, the signal transceiving control structure is configured to receive the second signal.

An embodiment of the disclosure further provides an electronic device, which includes any one of the above-mentioned signal transceiving control structures.

An embodiment of the disclosure further provides a signal transceiving control method, which includes the following operations.

A present network type is detected, and a target control branch is determined according to a detected network type and correspondences between the network types and the control branches; and the target control branch is controlled according to a received control instruction to perform transmission of a first signal or reception of a second signal.

Specifically, the number of the control branches is N, and the target control branch is one of the N control branches, where N is a positive integer greater than 1.

In the above solutions, when an output control switch in the target control branch is ON, an input control switch is OFF and an auxiliary control switch is ON, the target control branch works in a transmitting state and is configured to control the transmission of the first signal.

When the output control switch in the target control branch is OFF, the input control switch is ON and the auxiliary control switch is OFF, the target control branch works in a receiving state and is configured to control the reception of the second signal.

When the output control switch in the target control branch is OFF, the input control switch is ON and the auxiliary control switch is ON, the target control branch works in an isolation state and is configured to control signal interference between the target control branch and N−1 control branches except the target control branch.

In the above solutions, before the target control branch performs the transmission of the first signal, the method further includes the following operation. Filtering processing is performed on the first signal to filter out a noise signal out of the first signal.

After the target control branch performs the reception of the second signal, the method further includes the following operations. Filtering processing is performed on the second signal to filter out a noise signal out of the second signal; and analog-digital conversion processing is performed on the second signal in which the noise signal is filtered out.

An embodiment of the disclosure further provides a storage medium, the storage medium stores executable instructions, and the executable instructions implement the above signal transceiving control method when being executed by a processor.

In the technical solutions in the embodiments of the disclosure, the signal transceiving control structure includes the power amplifier and the N control branches. Specifically, the N control branches are configured to control transmission of the first signal or reception of the second signal in the different network types according to different control instructions. A first end of each of the N control branches is connected to an output end of the power amplifier. A second end of each of the N control branches is connected to each of the N external output ends. A third end of each of the N control branches is connected to each of the N external input/output ends, where N is the positive integer greater than 1. The power amplifier is configured to perform power amplification on the first signal. Therefore, in the embodiments of the disclosure, the reception or transmission of signals in different network types may be respectively controlled via the N control branches, thereby achieving the purposes of controlling the input and output of a radio-frequency signal and improving the isolation between internal ports of an output control module and an input control module. Moreover, the complexity of a circuit is reduced, and a demand on the high integration of components is satisfied.

DETAILED DESCRIPTION

To make the objectives, technical solutions and advantages of the embodiments of the disclosure clearer, the disclosure will be further described below in detail in combination with the accompanying drawings. The embodiments described below are a part of the embodiments of the disclosure rather than all of the embodiments of the disclosure. All of the other embodiments obtained by those skilled in the art based on the embodiments of the disclosure without any creative work fall within the scope of protection of the disclosure.

First Embodiment

Figure 2:
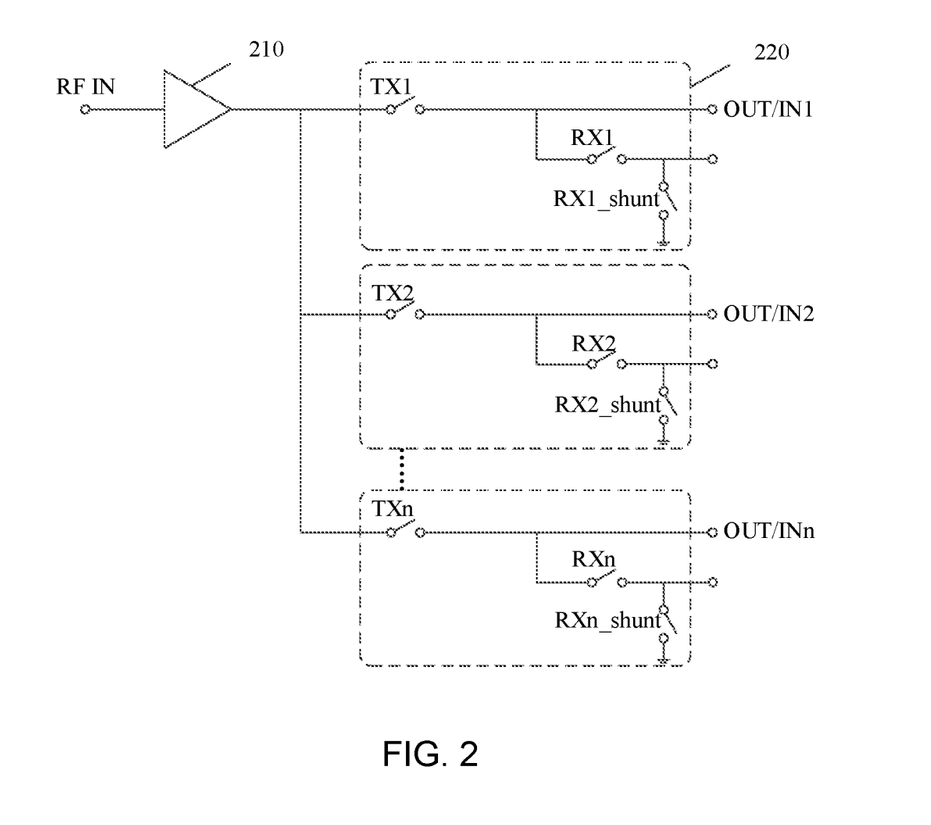
FIG. 2 is a schematic diagram of a composition structure of a signal transceiving control structure according to some embodiments of the disclosure.
Figure 4:
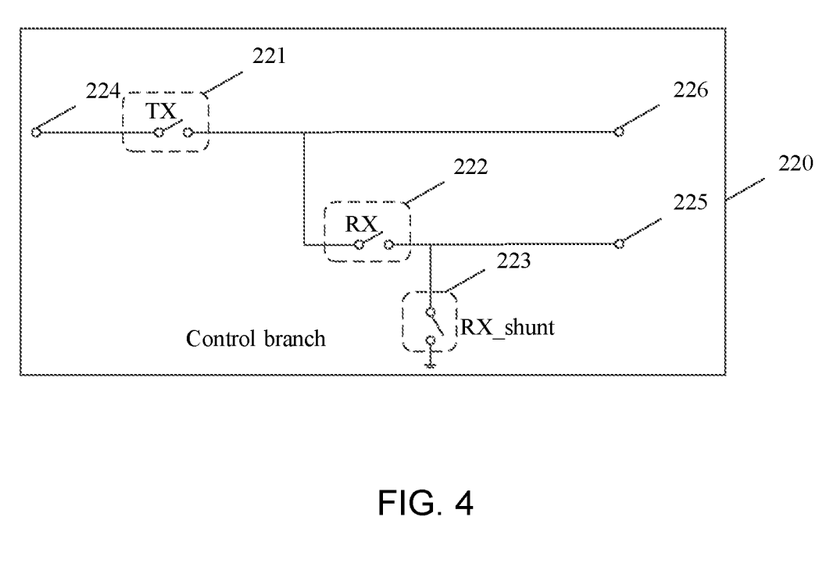
FIG. 4 is a schematic diagram of a composition structure of a control branch according to some embodiments of the disclosure.

The embodiment of the disclosure provides a signal transceiving control structure. FIG. 2 is a schematic diagram of a composition structure of a signal transceiving control structure according to an embodiment of the disclosure. As illustrated in FIG. 2, the signal transceiving control structure includes a power amplifier 210 and N control branches 220. The N control branches 220 are configured to select one of the N control branches 220 according to different control instructions to control transmission of a first signal or reception of a second signal in different network types. Each of the N control branches 220 includes three ends. As illustrated in FIG. 4, FIG. 4 is a schematic diagram of a composition structure of a control branch according to an embodiment of the disclosure. Specifically, a first end 224 of each of the N control branches 220 is connected to an output end of the power amplifier 210. A second end 225 of each of the N control branches 220 is connected to each of N external output ends. A third end 226 of each of the N control branches 220 is connected to each of N external input/output ends, where N is a positive integer greater than 1.

Herein, the first signal is a signal transmitted to the outside and may be referred to as an output signal. The second signal is a received signal sent by the outside and may be referred to as an input signal.

The power amplifier 210 is configured to perform power amplification on the output signal.

Herein, a network system of the signal includes: a second generation mobile communication network such as global system for mobile communication (GSM) and code division multiple access (CDMA), where the GSM includes a GSM900 and a digital cellular system at 1800 MHz (DCS1800); a third generation mobile communication network such as wideband code division multiple access (WCDMA), code division multiple access 2000 (CDMA2000) and time division-synchronous code division multiple access (TD-SCDMA); and a fourth generation mobile communication network such as time division long term evolution (TD-LTE) and frequency division dual long term evolution (LTE FDD), etc. In some embodiments, 3G, 4G, or 5G system can be included Herein, the control instruction includes a control instruction for controlling the GSM (including GSM900 and DCS1800), CDMA, WCDMA, CDMA2000, TD-SCDMA, LTE FDD (included) and TD-LTE. The control instruction is generated by an electronic device where the signal transceiving control structure is located when a signal in a certain network type is received or transmitted, thereby selecting a control branch suitable for the network type from the N control branches.

Specifically, the N control branches include N output control switches 221, N input control switches 222 and N auxiliary control switches 223. As illustrated in FIG. 4, a first end of each of the N output control switches 221 is connected to the power amplifier 210, and a second end of each of the N output control switches 221 is connected to a first end of each of the N input control switches 222. A second end of each of the N input control switches 222 is connected to a first end of each of the N auxiliary control switches 223. A second end of each of the N auxiliary control switches 223 is grounded.

Figure 3:
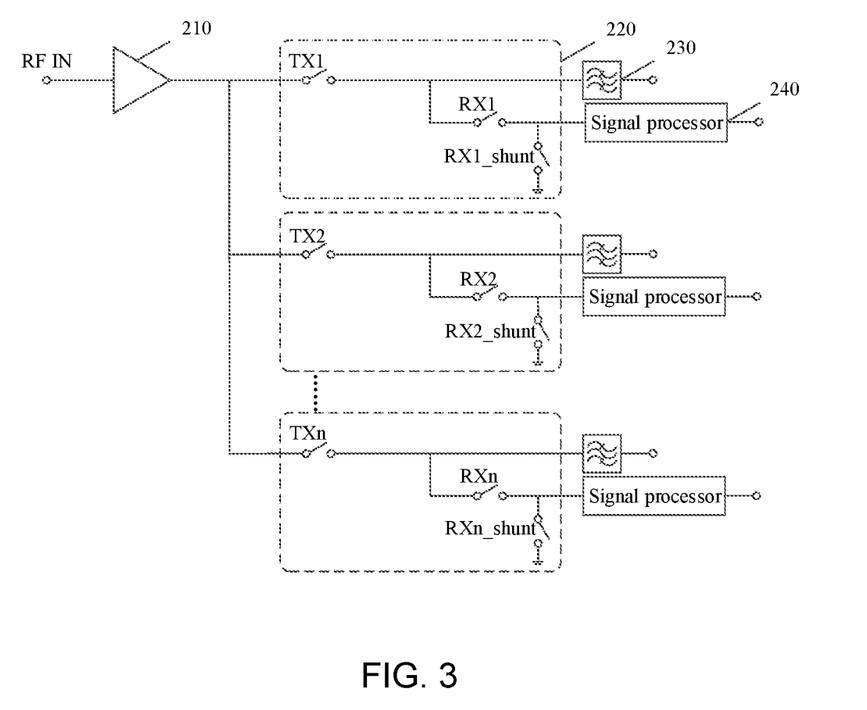
FIG. 3 is a schematic diagram of a composition structure of another signal transceiving control structure according to some embodiments of the disclosure.

The signal transceiving control structure in the embodiment of the disclosure is applied to an electronic device. In order to prevent the interference of a noise signal and satisfy a wireless communication quality of the electronic device, the signal transceiving control structure may be provided with N filters 230, or N duplexers 230, or M filters and K duplexers, where N is a positive integer greater than 1, M and K are positive integers, and M+K=N. As illustrated in FIG. 3, FIG. 3 is a schematic diagram of a composition structure of another signal transceiving control structure according to an embodiment of the disclosure. The filter and the duplexer are configured to perform filtering processing on the first signal and the second signal. In the embodiment of the disclosure, for the convenience, the filter is used when the filter or the duplexer is involved. The first signal is a transmitted signal, and the second signal is a received signal. A network type of the signal includes GSM, CDMA, WCDMA, TD-SCDMA, CDMA2000, TD-LTE and LTE FDD.

As illustrated in FIG. 3, each of the N filters 230 is in one-to-one connection with a third end of each of the N control branches 220. The signal transceiving control structure further includes: N filters, or N duplexers, or M filters and K duplexers, which are configured to perform filtering processing on the transmitted first signal and the received second signal. Each of the N filters is connected to a third end of each of the N control branches 220, and an output end of each of the N filters 230 is connected to each of the N external input/output ends. Or each of the N duplexers is connected to the third end of each of the N control branches 220, and an output end of each of the N duplexers 230 is connected to each of the N external input/output ends. Or an input end of each of the M filters 230 is connected to the third end of each of M control branches 220 in the N control branches 220, and an output end of each of the M filters 230 is connected to each of M external input/output ends in the N external input/output ends, and each of the K duplexers 230 is connected to a third end of each of the remaining K control branches 220 in the N control branches 220, and an output end of each of the K filters 230 is connected to each of the remaining K external input/output ends in the N external input/output ends. Therefore, when a signal is transmitted or received, the filtering processing can be performed on the signal to filter out an out-of-band noise signal.

Specifically, in the signal transceiving control structure, because of different network types for receiving or transmitting the signal, models of the used N filters 230 are also different. Hence, when the signal transceiving control structure works, a control branch is automatically selected according to the signals in the different network types, i.e., different filters are used to process the signal.

For example, it is assumed that three control branches and three filters are provided. A first control branch is connected to a filter for filtering out signals except GSM, a second control branch is connected to a filter for filtering out signals except WCDMA, and a third control branch is connected to a filter for filtering out signals except TD-SCDMA. Then, when a GSM signal is received or transmitted, the first control branch rather than the second and third control branches is automatically selected by the system to control and process the GSM signal. Likewise, when a WCDMA signal or a TD-SCDMA signal is received or transmitted, the second control branch or the third control branch is also correspondingly and automatically selected, rather than other control branches.

In an embodiment of the disclosure, the signal transceiving control structure further includes at least one signal processor 240 configured to process the second signal (i.e., the received signal) to implement analog-to-digital conversion. As illustrated in FIG. 3, an input end of each of the at least one signal processor 240 is connected to the second end of each of the N control branches 220, and an output end of each of the at least one signal processor 240 is connected to each of the N external output ends.

In an embodiment of the disclosure, when an i-th output control switch in an i-th control branch is ON, an i-th input control switch is OFF and an i-th auxiliary control switch is ON, the i-th control branch works in a transmitting state and is configured to control the transmission of the first signal.

When the i-th output control switch in the i-th control branch is OFF, the i-th input control switch is ON and the i-th auxiliary control switch is OFF, the i-th control branch works in a receiving state and is configured to control the reception of the second signal.

When the i-th output control switch in the i-th control branch is OFF, the i-th input control switch is ON and the i-th auxiliary control switch is ON, the i-th control branch works in an isolation state and is configured to control signal interference between the i-th control branch and N−1 control branches except the i-th control branch.

The i-th control branch is one of the N control branches 220, where i is a positive integer less than or equal to the N.

Specifically, when the i-th control branch is in the transmitting state, an output control switch of each of other control branches except the i-th control branch is OFF, an input control switch of each of other control branches except the i-th control branch is ON, and an auxiliary control switch of each of other control branches except the i-th control branch is ON. Therefore, even though a signal transmitted by the i-th control branch is leaked to other branches, the signal is grounded via an RX and an RX-shunt of the branch, thus no interference is generated to other control branches as well as components connected to the control branches, thereby achieving the isolation effect.

In an embodiment of the disclosure, when the i-th control branch works in the transmitting state, and N−1 control branches except the i-th control branch work in the isolation state, the signal transceiving control structure is configured to transmit the first signal.

When the i-th control branch works in the receiving state, and the N−1 control branches except the i-th control branch work in the isolation state, the signal transceiving control structure is configured to receive the second signal.

Specifically, when an output control switch TX1 of a first control branch is ON, an input control switch RX1 of the first control branch is OFF, and an auxiliary control switch RX1-shunt of the first control branch is ON, and an output control switch TX of each of the second to the Nth control branches except the first control branch is OFF, an input control switch RX of each of the second to the Nth control branches except the first control branch is ON and an auxiliary control switch RX-shunt of each of the second to the Nth control branches except the first control branch is ON, the signal transceiving control structure is configured to transmit a signal in a special network type. When the output control switch TX1 of the first control branch is OFF, the input control switch RX1 of the first control branch is ON, and the auxiliary control switch RX1-shunt of the first control branch is OFF, and the output control switch TX of each of the second to the Nth control branches except the first control branch is OFF, the input control switch RX of each of the second to the Nth control branches except the first control branch is ON and the auxiliary control switch RX-shunt of each of the second to the Nth control branches except the first control branch is ON, the signal transceiving control structure is configured to receive a signal in a special network type.

In the technical solution of the embodiment of the disclosure, each control branch in the signal transceiving control structure can control the transmission and reception of the radio-frequency signal and control the signal interference between different control branches by only using three control switches. By using such a design, the number of switches of the control circuit is reduced, and a size of the signal transceiving control structure is reduced, thereby satisfying the requirement on high integration. Besides, since the number of the switches of the control circuit is reduced, the generation of a parasitic capacitance is reduced, and the insertion loss of the input control switch/output control switch is reduced.

Second Embodiment

The embodiment of the disclosure further provides an electronic device, which includes the signal transceiving control structure according to the embodiment of the disclosure. Specifically, as illustrated in FIG. 2, the signal transceiving control structure includes a power amplifier 210 and N control branches 220. The N control branches 220 are configured to control transmission of a first signal or reception of a second signal in different network types according to different control instructions. Each of the N control branches 220 includes three ends. As illustrated in FIG. 4, FIG. 4 is a schematic diagram of a composition structure of a control branch according to an embodiment of the disclosure. A first end 224 of each of the N control branches 220 is connected to an output end of the power amplifier 210. A second end 225 of each of the N control branches is connected to each of N external output ends. A third end 226 of each of the N control branches 220 is connected to each of N external input/output ends, where N is a positive integer greater than 1.

Herein, the first signal is a signal transmitted to the outside and may be referred to as an output signal. The second signal is a received signal sent by the outside and may be referred to as an input signal.

The power amplifier 210 is configured to perform power amplification on the output signal.

Herein, a network system of the signal includes: a second-generation mobile communication network such as GSM and CDMA, where the GSM includes GSM900 and DCS1800; a third generation mobile communication network such as WCDMA, CDMA2000 and TD-SCDMA; and a fourth generation mobile communication network such as TD-LTE and LTE FDD.

Herein, the control instruction includes control instructions for controlling GSM (including GSM900 and DCS1800), CDMA, WCDMA, CDMA2000, TD-SCDMA, LTE FDD and TD-LTE. The control instruction is generated by an electronic device where the signal transceiving control structure is located when a signal in a certain network type is received or transmitted, thereby selecting a control branch suitable for the network type from the N control branches.

Specifically, the N control branches include N output control switches 221, N input control switches 222 and N auxiliary control switches 223. As illustrated in FIG. 4, a first end of each of the N output control switches 221 is connected to the power amplifier 210. A second end of each of the N output control switches 221 is connected to a first end of each of the N input control switches 222. A second end of each of the N input control switches 222 is connected to a first end of each of the N auxiliary control switches 223. A second end of each of the N auxiliary control switches 223 is grounded.

In order to prevent the interference of a noise signal and satisfy a wireless communication quality of the electronic device, the signal transceiving control structure may be provided with N filters 230, or N duplexers 230, or M filters and K duplexers, where N is a positive integer greater than 1, M and K are positive integers, and M+K=N. As illustrated in FIG. 3, FIG. 3 is a schematic diagram of a composition structure of another signal transceiving control structure according to an embodiment of the disclosure. The filter and the duplexer are configured to perform filtering processing on the first signal and the second signal. In the embodiment of the disclosure, for the convenience, the filter is used when the filter or the duplexer is involved. The first signal is a transmitted signal, the second signal is a received signal. A network type for each of the signals includes GSM, CDMA, WCDMA, TD-SCDMA, CDMA2000, TD-LTE and LTE FDD.

As illustrated in FIG. 3, each of the N filters 230 is in one-to-one connection with a third end of each of the N control branches 220. The signal transceiving control structure further includes: N filters, or N duplexers, or M filters and K duplexers, which are configured to perform filtering processing on the transmitted first signal and the received second signal. Each of the N filters is connected to a third end of each of the N control branches 220, and an output end of each of the N filters 230 is connected to each of the N external input/output ends. Or each of the N duplexers is connected to the third end of each of the N control branches 220, and an output end of each of the N duplexers 230 is connected to each of the N external input/output ends. Or an input end of each of the M filters 230 is connected to a third end of each of M control branches 220 in the N control branches 220, an output end of each of the M filters 230 is connected to each of M external input/output ends in the N external input/output ends, and each of the K duplexers 230 is connected to a third end of each of the remaining K control branches 220 in the N control branches 220, and an output end of each of the K filters 230 is connected to each of the remaining K external input/output ends in the N external input/output ends. Therefore, when a signal is transmitted or received, the filtering processing can be performed on the signal to filter out an out-of-band noise signal.

Specifically, in the signal transceiving control structure, because of different network types of the received or transmitted signals, models of the used N filters 230 are also different. Hence, when the signal transceiving control structure works, a control branch is automatically selected according to the signals in a different network types, i.e., different filters are used to process the signals.

For example, it is assumed that three control branches and three filters are provided. A first control branch is connected to a filter for filtering out signals except GSM, a second control branch is connected to a filter for filtering out signals except WCDMA, and a third control branch is connected to a filter for filtering out signals except TD-SCDMA. Then, when a GSM signal is received or transmitted, the first control branch rather than the second and third control branches is automatically selected by the system to control and process the GSM signal. Likewise, when a WCDMA signal or a TD-SCDMA signal is received or transmitted, the second control branch or the third control branch is also respectively and automatically selected, rather than other control branches.

In an embodiment of the disclosure, the signal transceiving control structure further includes at least one signal processor 240 configured to process the second signal (i.e., the received signal) to implement analog-to-digital conversion. As illustrated in FIG. 3, an input end of each of the at least one signal processor 240 is connected to a second end of each of the N control branches 220, and an output end of each of the at least one signal processor 240 is connected to each of the N external output ends.

In an embodiment of the disclosure, when an i-th output control switch in an i-th control branch is ON, an i-th input control switch in the i-th control branch is OFF and an i-th auxiliary control switch in the i-th control branch is ON, the i-th control branch works in a transmitting state and is configured to control transmission of the first signal.

When the i-th output control switch in the i-th control branch is OFF, the i-th input control switch in the i-th control branch is ON and the i-th auxiliary control switch in the i-th control branch is OFF, the i-th control branch works in a receiving state and is configured to control reception of the second signal.

When the i-th output control switch in the i-th control branch is OFF, the i-th input control switch in the i-th control branch is ON and the i-th auxiliary control switch in the i-th control branch is ON, the i-th control branch works in an isolation state and is configured to control signal interference between the i-th control branch and N−1 control branches except the i-th control branch.

The i-th control branch is one of the N control branches 220, where i is a positive integer less than or equal to N.

Specifically, when the i-th control branch is in the transmitting state, an output control switch of each of other control branches except the i-th control branch is OFF, an input control switch of other control branches except the i-th control branch is ON, and an auxiliary control switch of other control branches except the i-th control branch is ON. Therefore, even though a signal transmitted by the i-th control branch is leaked to the other branches, the signal is grounded via an RX and an RX-shunt of the branch, thus no interference is generated to other control branches as well as components connected to the control branches, thereby achieving the isolation effect.

In an embodiment of the disclosure, when the i-th control branch works in the transmitting state, and N−1 control branches except the i-th control branch work in the isolation state, the signal transceiving control structure is configured to transmit the first signal.

When the i-th control branch works in the receiving state, and N−1 control branches except the i-th control branch work in the isolation state, the signal transceiving control structure is configured to receive the second signal.

Specifically, when an output control switch TX1 of a first control branch is ON, an input control switch RX1 of the first control branch is OFF, and an auxiliary control switch RX1-shunt of the first control branch is ON, and an output control switch TX of each of the second to the Nth control branches except the first control branch is OFF, an input control switch RX of each of the second to the Nth control branches except the first control branch is ON and an auxiliary control switch RX-shunt of each of the second to the Nth control branches except the first control branch is ON, the signal transceiving control structure is used in transmission of a signal in a special network type. When the output control switch TX1 of the first control branch is OFF, the input control switch RX1 of the first control branch is ON, and the auxiliary control switch RX1-shunt of the first control branch is OFF, and the output control switch TX of each of the second to the Nth control branches except the first control branch is OFF, the input control switch RX of each of the second to the Nth control branches except the first control branch is ON and the auxiliary control switches RX-shunt of each of the second to the Nth control branches except the first control branch is ON, the signal transceiving control structure is used in reception of a signal in a special network type.

In the technical solutions in the embodiment of the disclosure, each control branch in the signal transceiving control structure can control transmission and reception of the radio-frequency signal and control the signal interference between different control branches by only using three control switches. By using such a design, the number of switches of the control circuit is reduced, and a size of the signal transceiving control structure is reduced, thereby satisfying the requirement on high integration. Besides, since the number of the switches of the control circuit is reduced, the generation of a parasitic capacitance is also reduced, and the insertion loss of input control switch/output control switch is reduced.

Third Embodiment

Figure 5:
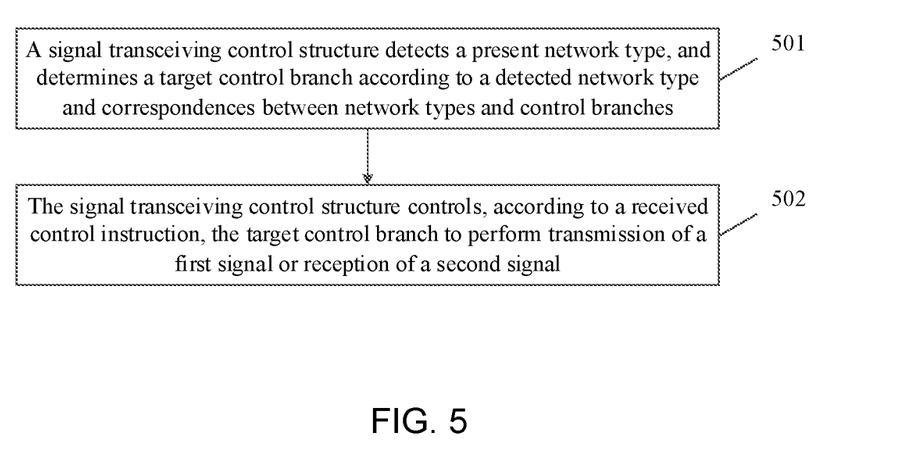
FIG. 5 is a schematic diagram of a flow of a signal transceiving control method according to some embodiments of the disclosure.

FIG. 5 is a schematic diagram of a flow structure of a signal transceiving control method according to an embodiment of the disclosure. As illustrated in FIG. 5, the signal transceiving control method may include the following operations.

At block 501, a signal transceiving control structure detects a present network type, and determines a target control branch according to the detected network type and correspondences between the network types and the control branches.

Herein, the number of the control branches is N, and the target control branch is one of the N control branches, where N is a positive integer greater than 1.

Herein, the signal transceiving control structure includes: a power amplifier, N control branches, at least one signal processor as well as N filters, or N duplexers, or M filters and K duplexers (M+K=N). Before the signal transceiving control structure is applied to an electronic device, the correspondences between the network types and the control branches are set.

Herein, the network system of the signal includes but is not limited to: a second generation mobile communication network such as GSM and CDMA, where the GSM includes GSM900 and DCS1800; a third generation mobile communication network such as WCDMA, CDMA2000 and TD-SCDMA; and a fourth generation mobile communication network such as TD-LTE and LTE FDD.

Herein, the control instruction includes control instructions for controlling GSM (including GSM900 and DCS1800), CDMA, WCDMA, CDMA2000, TD-SCDMA, LTE FDD and TD-LTE. The control instruction is generated by an electronic device where the signal transceiving control structure is located when a signal in some network type is received or transmitted, thereby selecting a control branch suitable for the network type from the N control branches.

In an embodiment of the disclosure, when an output control switch in the target control branch is ON, an input control switch is OFF and an auxiliary control switch is ON, the target control branch works in a transmitting state and is configured to control transmission of the first signal.

In an embodiment of the disclosure, when the output control switch in the target control branch is OFF, the input control switch is ON and the auxiliary control switch is OFF, the target control branch works in a receiving state and is configured to control reception of the second signal.

In an embodiment of the disclosure, when the output control switch in the target control branch is OFF, the input control switch is ON and the auxiliary control switch is ON, the target control branch works in an isolation state and is configured to control signal interference between the target control branch and N-1 control branches except the target control branch.

At block 502: the signal transceiving control structure controls the target control branch according to a received control instruction to perform transmission of a first signal or reception of a second signal.

Herein, the first signal is a signal transmitted to the outside and may be referred to as an output signal. The second signal is a received signal sent by the outside and may be referred to as an input signal.

Specifically, it is assumed that a GSM network signal is controlled by the target control branch. In this case, the signal transceiving control structure controls, according to a received control instruction, the target control branch to perform the transmission of the first signal of the GSM network, or controls the target control branch to perform the reception of the second signal of the GSM network.

In an embodiment of the disclosure, when the target control branch works in the transmitting state, and N-1 control branches except the target control branch work in the isolation state, the signal transceiving control structure outputs the first signal.

In an embodiment of the disclosure, when the target control branch works in the receiving state, and N-1 control branches except the target control branch work in the isolation state, the signal transceiving control structure inputs the second signal.

In an embodiment of the disclosure, before the target control branch is controlled to perform the transmission of the first signal, the method further includes the following operation. A filter or a duplexer in the signal transceiving control structure performs filtering processing on the first signal to filter out a noise signal out of the first signal.

After the target control branch is controlled to perform the reception of the second signal, the method further includes the following operation. A filter or a duplexer in the signal transceiving control structure performs filtering processing on the second signal to filter out a noise signal out of the second signal.

In an embodiment of the disclosure, a processing circuit such as a signal processor in the signal transceiving control structure performs analog-to-digital conversion processing on the second signal in which the noise signal is filtered out.

In the technical solution in the embodiment of the disclosure, on one hand, a control branch is selected according to a network type of a signal to control transmission and reception of a radio-frequency signal, and the signal interference between different control branches is controlled; and on the other hand, compared with the related art illustrated in FIG. 1, since the number of switches of the control circuit is reduced, the insertion loss of the signal is reduced.

In addition, a part of the technical solution of the embodiments of the disclosure, which is essential or makes a contribution to the related art may be embodied in the form of a software product. The software product is stored in a storage medium, including several instructions to cause a mobile device to execute all or part of the method according to each embodiment of the disclosure. The above-mentioned storage medium includes various media capable of storing program codes such as a flash memory. In this way, the embodiments of the disclosure are not limited to any combination of specific hardware and software.

Correspondingly, an embodiment of the disclosure further provides a storage medium, such as a non-transitory computer-readable storage medium, which stores a program including instructions, and the program, when executed by a processing circuit, can realize the signal transceiving control method in the above embodiment of the disclosure.

The above are only preferred embodiments of the disclosure, and are not intended to limit the scope of protection of the disclosure. Any modification, equivalent substitution and improvement made within the spirit and scope of the disclosure all are included in the scope of protection of the disclosure.

In the technical solution according to the embodiments of the disclosure, reception or transmission of signals in different network types are controlled by N control branches, thereby achieving the purposes of controlling the input and output of a radio-frequency signal and improving the isolation between internal ports of an output control module and an input control module, and the complexity of the circuit is reduced, and a demand on the high integration of the components is satisfied.

The invention claimed is:

1. A signal transceiving control structure, comprising: a power amplifier and N control branches, wherein the N control branches are configured to control transmission of a first signal or reception of a second signal in different network types according to different control instructions; a first end of each of the N control branches is connected to an output end of the power amplifier, a second end of each of the N control branches is connected to each of N external output ends, and a third end of each of the N control branches is connected to each of N external input/output ends, where N is a positive integer greater than 1;

the power amplifier is configured to perform power amplification on the first signal;

the N control branches comprise N output control switches, N input control switches and N auxiliary control switches;

a first end of each of the N output control switches is connected to the power amplifier, and a second end of each of the N output control switches is connected to a first end of each of the N input control switches;

a second end of each of the N input control switches is connected to a first end of each of the N auxiliary control switches;

a second end of each of the N auxiliary control switches is grounded;

the signal transceiving control structure further comprising: at least one signal processor, configured to process the second signal to implement analog-to-digital conversion, wherein an input end of each of the at least one signal processor is connected to the second end of each of the N control branches, and an output end of each of the at least one signal processor is connected to each of the N external output ends;

the signal transceiving control structure further comprising: N filters, or N duplexers, or M filters and K duplexers, which are configured to perform filtering processing on the first signal and the second signal, where M and K are positive integers less than or equal to the N, and M+K=N;

an input end of each of the N filters is connected to the third end of each of the N control branches, and an output end of each of the N filters is connected to each of the N external input/output ends;

or an input end of each of the N duplexers is connected to the third end of each of the N control branches, and an output end of each of the N duplexers is connected to each of the N external input/output ends;

or an input end of each of the M filters is connected to a third end of each of M control branches in the N control branches, and an output end of each of the M filters is connected to each of M external input/output ends in the N external input/output ends, each of the K duplexers is connected to a third end of each of the remaining K control branches in the N control branches, and an output end of each of the K filters is connected to each of the remaining K external input/output ends in the N external input/output ends.

2. The signal transceiving control structure of claim 1, wherein when an i-th output control switch in an i-th control branch is ON, an i-th input control switch is OFF in the i-th control branch and an i-th auxiliary control switch in the i-th control branch is ON, the i-th control branch works in a transmitting state and is configured to control transmission of the first signal;

when the i-th output control switch in the i-th control branch is OFF, the i-th input control switch in the i-th control branch is ON and the i-th auxiliary control switch in the i-th control branch is OFF, the i-th control branch works in a receiving state and is configured to control reception of the second signal;

when the i-th output control switch in the i-th control branch is OFF, the i-th input control switch in the i-th control branch is ON and the i-th auxiliary control switch in the i-th control branch is ON, the i-th control branch works in an isolation state and is configured to control signal interference between the i-th control branch and N−1 control branches except the i-th control branch; and the i-th control branch is one of the N control branches, where i is a positive integer less than or equal to N.

3. The signal transceiving control structure of claim 2, wherein when the i-th control branch works in the transmitting state, and the N−1 control branches except the i-th control branch work in the isolation state, the signal transceiving control structure is configured to transmit the first signal; or when the i-th control branch works in the receiving state, and the N−1 control branches except the i-th control branch work in the isolation state, the signal transceiving control structure is configured to receive the second signal.

4. An electronic device, comprising the signal transceiving control structure of claim 1, wherein the electronic device is one of a wireless pager, a mobile phone, or a personal digital assistant.

5. The electronic device of claim 4, further comprising a radio frequency (RF) circuit configured to be controlled by the transceiving control structure, and a processing circuit.

6. The electronic device of claim 5, further comprising a non-transitory computer-readable storage medium having instructions stored thereon for execution by the processing circuit to implement a signal transceiving control method, wherein correspondences between network types and N control branches are set, and wherein the signal transceiving control method comprises:

detecting a present network type, and determining a target control branch according to a detected network type and the correspondences between the network types and the control branches, wherein the target control branch is one of the N control branches, where N is a positive integer greater than 1; and controlling the target control branch according to a received control instruction to perform transmission of a first signal or reception of a second signal.

7. The electronic device of claim 6, wherein the signal transceiving control method further comprises:

when an output control switch in the target control branch is ON, an input control switch in the target control branch is OFF and an auxiliary control switch in the target control branch is ON, the target control branch works in a transmitting state and is configured to control the transmission of the first signal;

when the output control switch in the target control branch is OFF, the input control switch in the target control branch is ON and the auxiliary control switch in the target control branch is OFF, the target control branch works in a receiving state and is configured to control the reception of the second signal; and when the output control switch in the target control branch is OFF, the input control switch in the target control branch is ON and the auxiliary control switch in the target control branch is ON, the target control branch works in an isolation state and is configured to control signal interference between the target control branch and N−1 control branches except the target control branch.

8. The electronic device of claim 7, wherein the signal transceiving control method further comprises:
prior to controlling the target control branch to perform the transmission of the first signal,
performing filtering processing on the first signal to filter out a noise signal out of the first signal; and
further comprising: after controlling the target control branch to perform the reception of the second signal,
performing filtering processing on the second signal to filter out a noise signal out of the second signal; and
performing analog-digital conversion processing on the second signal in which the noise signal is filtered out.

9. A signal transceiving control method implemented with the signal trasceiving control structure of claim 1, wherein correspondences between network types and N control branches are set, and wherein the method comprises:
detecting a present network type, and determining a target control branch according to a detected network type and the correspondences between the network types and the control branches, wherein the target control branch is one of the N control branches, where N is a positive integer greater than 1; and
controlling the target control branch according to a received control instruction to perform transmission of a first signal or reception of a second signal.

10. The signal transceiving control method of claim 9, further comprising:
when an output control switch in the target control branch is ON, an input control switch in the target control branch is OFF and an auxiliary control switch in the target control branch is ON, the target control branch works in a transmitting state and is configured to control the transmission of the first signal;
when the output control switch in the target control branch is OFF, the input control switch in the target control branch is ON and the auxiliary control switch in the target control branch is OFF, the target control branch works in a receiving state and is configured to control the reception of the second signal; and
when the output control switch in the target control branch is OFF, the input control switch in the target control branch is ON and the auxiliary control switch in the target control branch is ON, the target control branch works in an isolation state and is configured to control signal interference between the target control branch and N−1 control branches except the target control branch.

11. The signal transceiving control method of claim 10, further comprising: prior to controlling the target control branch to perform the transmission of the first signal,
performing filtering processing on the first signal to filter out a noise signal out of the first signal; and
further comprising: after controlling the target control branch to perform the reception of the second signal,
performing filtering processing on the second signal to filter out a noise signal out of the second signal; and
performing analog-digital conversion processing on the second signal in which the noise signal is filtered out.

12. A non-transitory computer-readable storage medium storing instructions for execution by a processing circuit to implement the signal transceiving control method of claim 9.

* * * * *